(12) United States Patent
Motoyama et al.

(10) Patent No.: US 12,382,840 B2
(45) Date of Patent: Aug. 5, 2025

(54) DAMASCENE MRAM DEVICE

(71) Applicant: INTERNATIONAL BUSINESS MACHINES CORPORATION, Armonk, NY (US)

(72) Inventors: Koichi Motoyama, Clifton Park, NY (US); Oscar van der Straten, Guilderland Center, NY (US); Chih-Chao Yang, Glenmont, NY (US)

( * ) Notice: Subject to any disclaimer, the term of this patent is extended or adjusted under 35 U.S.C. 154(b) by 516 days.

(21) Appl. No.: 17/806,511

(22) Filed: Jun. 13, 2022

(65) Prior Publication Data

US 2023/0403947 A1 Dec. 14, 2023

(51) Int. Cl.
*H10N 50/80* (2023.01)
*H10B 61/00* (2023.01)
*H10N 50/01* (2023.01)

(52) U.S. Cl.
CPC ............. *H10N 50/80* (2023.02); *H10B 61/00* (2023.02); *H10N 50/01* (2023.02)

(58) Field of Classification Search
None
See application file for complete search history.

(56) References Cited

U.S. PATENT DOCUMENTS

| | | |
|---|---|---|
| 8,455,965 B2 | 6/2013 | Li |
| 8,644,063 B2 | 2/2014 | Li |
| 9,564,577 B1 | 2/2017 | Hsu |
| 10,692,925 B2 | 6/2020 | Rizzolo |
| 10,950,549 B2 | 3/2021 | Seo |
| 11,024,797 B2 | 6/2021 | Yang |
| 11,038,097 B2 | 6/2021 | Doris |
| 2004/0175847 A1* | 9/2004 | Fricke ............ H10B 61/10 257/E27.005 |
| 2015/0056722 A1 | 2/2015 | Li |
| 2016/0111629 A1* | 4/2016 | Toh ............... H10N 50/01 257/421 |
| 2021/0119113 A1 | 4/2021 | Marchack |

OTHER PUBLICATIONS

Dillinger, "Technology Optimization for Magnetoresistive RAM (STT-MRAM)", Jan. 6, 2021, 11 pages.

* cited by examiner

*Primary Examiner* — Xiaoming Liu

(57) ABSTRACT

A magnetic tunnel junction (MTJ) stack, a vertical side surface of the MTJ stack includes a saw tooth edge, the MTJ stack includes vertically aligned layers of a top electrode, a free layer, a tunneling barrier, a reference layer and a bottom electrode, the free layer of the MTJ stack has a tapered edge including a first width at an upper portion of the free layer and a second width at a lower portion of the free layer, the first width is greater than the second width. Forming a first bottom electrode of a first MTJ stack, a second bottom electrode of a second MTJ stack, a first inter-layer dielectric between the first and the second bottom electrode, a first reference layer of the first MTJ stack, a second reference layer of the second MTJ stack, a second inter-layer dielectric between the first reference layer and the second reference layer.

18 Claims, 16 Drawing Sheets

DAMASCENE MRAM DEVICE

BACKGROUND

The present invention relates, generally, to the field of semiconductor manufacturing, and more particularly to fabricating a magnetic tunnel junction device with individually tapered layers.

Magneto resistive random-access memory ("MRAM") devices are used as non-volatile computer memory. MRAM data is stored by magnetic storage elements. The elements are formed from two ferromagnetic layers, each of which can hold a magnetic field, separated by a spin conductor layer. One of the two layers is a reference magnet, or a reference layer, set to a particular polarity, while the remaining layer's field can be changed to match that of an external field to store memory and is termed the "free magnet" or "free-layer". This configuration is known as the magnetic tunnel junction (MTJ) and is the simplest structure for a MRAM bit of memory.

SUMMARY

According to an embodiment of the present invention, a semiconductor device is provided. The semiconductor device including a magnetic tunnel junction (MTJ) stack, where a vertical side surface of the MTJ stack includes a saw tooth edge.

According to an embodiment of the present invention, a semiconductor device is provided. The semiconductor device including a magnetic tunnel junction (MTJ) stack, where a vertical side surface of the MTJ stack includes a saw tooth edge, the MTJ stack includes vertically aligned layers of a top electrode, a free layer, a tunneling barrier, a reference layer and a bottom electrode, where the free layer of the MTJ stack has a tapered edge including a first width at an upper portion of the free layer and a second width at a lower portion of the free layer, where the first width is greater than the second width.

According to an embodiment of the present invention, a method is provided. The method including forming a first bottom electrode of a first magnetic tunnel function (MTJ) stack, forming a second bottom electrode of a second magnetic tunnel function (MTJ) stack, forming a first inter-layer dielectric between the first bottom electrode and the second bottom electrode, forming a first reference layer of the first magnetic tunnel function (MTJ) stack, forming a second reference layer of the second magnetic tunnel function (MTJ) stack, and forming a second inter-layer dielectric between the first reference layer and the second reference layer.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
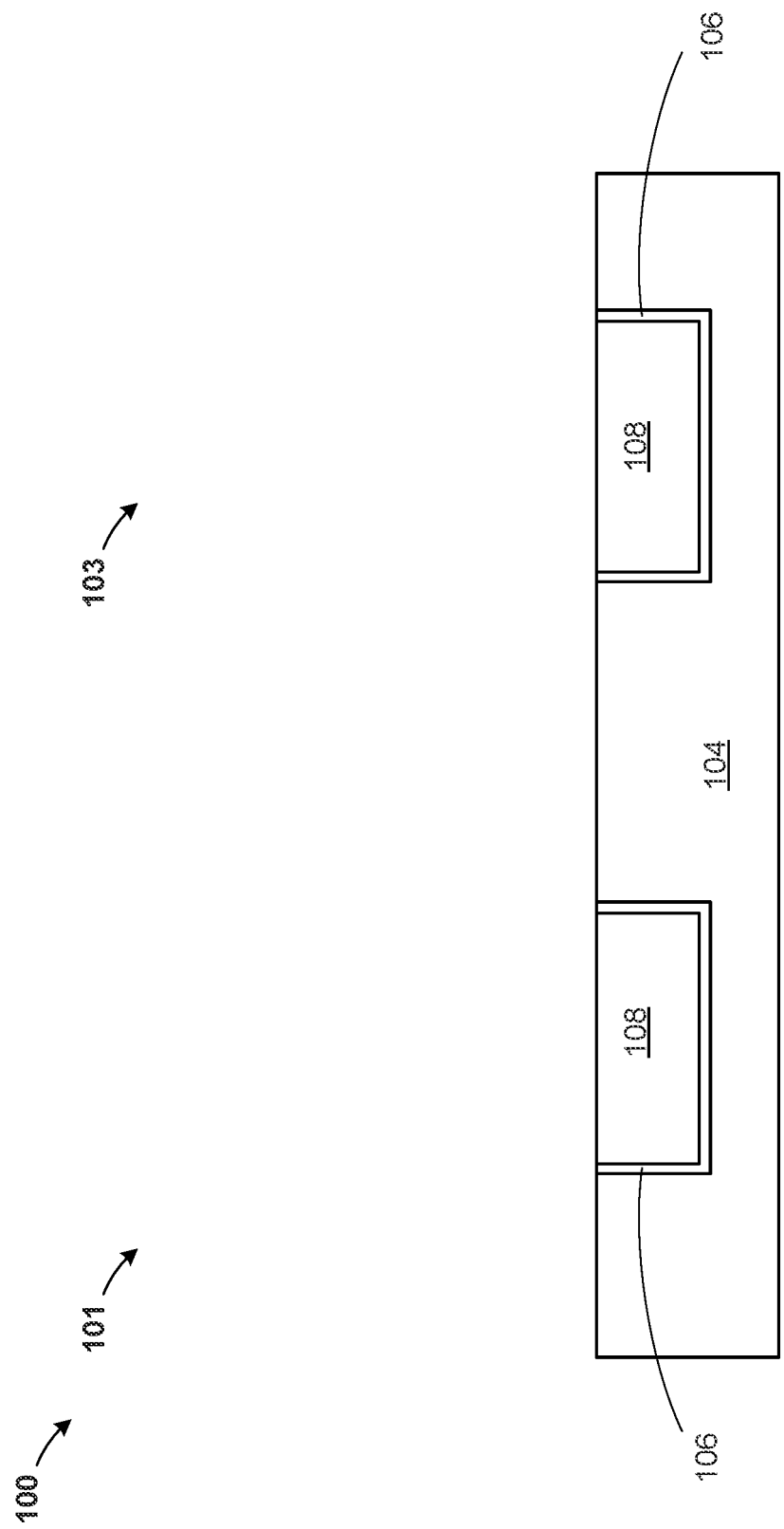
FIG. 1 illustrates a cross-sectional view of a multi-state memory cell, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As stated above, magneto resistive random-access memory (hereinafter "MRAM") devices are a non-volatile computer memory technology. MRAM data is stored by magnetic storage elements. The elements are formed from two ferromagnetic layers, each of which can hold a magnetic field, separated by a spin conductor layer. One of the two layers is a reference magnet, or a reference layer, set to a particular polarity, while the remaining layer's field can be changed to match that of an external field to store memory and is termed the "free magnet" or "free-layer". The magnetic reference layer may be referred to as a reference layer, and the remaining layer may be referred to as a free layer. This configuration is known as the magnetic tunnel junction (hereinafter "MTJ") and is the simplest structure for a MRAM bit of memory.

A memory device is built from a grid of such memory cells or bits. In some configurations of MRAM, such as the type further discussed herein, the magnetization of the magnetic reference layer is fixed in one direction (up or down), and the direction of the magnetic free layer can be switched by external forces, such as an external magnetic field or a spin-transfer torque generating charge current. A smaller current (of either polarity) can be used to read resistance of the device, which depends on relative orientations of the magnetizations of the magnetic free layer and the magnetic reference layer. The resistance is typically higher which the magnetizations are anti-parallel and lower when they are parallel, though this can be reversed, depending on materials used in fabrication of the MRAM.

The MRAM stack layers may be conformally formed using known techniques. In formation of the MTJ stacks layers, the reference layer is formed on a dielectric and a bottom electrode. The tunneling barrier layer is formed on the reference layer. In an embodiment, the tunneling barrier layer is a barrier, such as a thin insulating layer or electric potential, between two electrically conducting materials. Electrons (or quasiparticles) pass through the tunneling barrier layer by the process of quantum tunneling. In certain embodiments, the tunneling barrier layer includes at least one sublayer composed of magnesium oxide (MgO). It should be appreciated that materials other than MgO can be used to form the tunneling barrier layer. The free layer is a magnetic free layer that is adjacent to tunneling barrier layer and opposite the reference layer. The free layer has a magnetic moment or magnetization that can be flipped. It should also be appreciated that the MTJ stack layers may include additional layers, omit certain layers, and each of the layers may include any number of sublayers. Moreover, the composition of layers and/or sublayers may be different between the different MRAM stacks.

For high performance MRAM devices based on perpendicular magnetic tunnel junction (MTJ) structures, well-defined interfaces and interface control are essential. MTJ structures typically include a cobalt (Co) based synthetic anti-ferromagnet (SAF), a CoFeB-based reference layer, a MgO-based tunnel barrier, a CoFeB-based free layer, and cap layers containing e.g. tantalum (Ta) and/or ruthenium (Ru). Embedded MTJ structures are usually formed by subtractive patterning of blanket MTJ stacks into pillars between two metal levels. In this disclosure, after each layer of MTJ stack patterning, inter-pillar spaces are filled with inter-layer dielectric (hereinafter "ILD") to enable connection to BEOL wiring by a top contact level. ILD gap fill between pillars presents a significant challenge since the presence of voids in the ILD between the pillars can lead to shorts.

The present invention relates to fabricating a MTJ device with individually formed bottom electrode, reference layer, tunneling barrier with free layer, and top electrode layers which are individually tapered, resulting in a saw tooth vertical side of the MTJ device.

The MTJ device with individually formed bottom electrode, reference layer, tunneling barrier with free layer, and top electrode layers, has corresponding individually formed ILD surrounding each MTJ layer. A resulting MTJ device has an improved ILD with less voiding than a single layer of ILD of a same total height. Specifically, an ILD formed with a greater height or thickness has more voiding than an ILD formed with a smaller height or thickness. The MTJ device with individual ILD layers surrounding each MTJ layer has less voiding than a MTJ device which is formed by first forming all the MTJ layers, forming individual MJT devices by removing portions of all the MTJ layers simultaneously, and then forming a single ILD surrounding the entire height of the MTJ layers.

The MTJ device with individually formed layers extends scalability of MTJ devices due to reduced voiding between MTJ device pillars. ILD gap fill between pillars presents a significant challenge since the presence of voids in the ILD between the pillars can lead to shorts. These shorts are caused by metallization of the top contact level. When the top contact level is metallized, void in the dielectric is also filled with metal, which causes the short.

The MTJ device with individually formed layers improved MRAM performance due to reduced shorts between top contacts of adjacent MTJ device pillars.

Damascene is the method of BEOL interconnect formation. A dielectric is deposited, patterned, and the resulting feature is metallized. Any metal overburden is removed by planarization.

Referring now to FIG. 1, a semiconductor structure 100 (hereinafter "structure") at an intermediate stage of fabrication is shown according to an exemplary embodiment. FIG. 1 is a cross-sectional view of the structure 100. The structure 100 may be formed or provided. The structure 100 may include a cell 101 and a cell 103. The cells 101, 103, each includes, for example, an inter-layer dielectric (hereinafter "ILD") 104, a liner 106 and a lower metal wire 108.

The structure 100 may include several back end of line ("BEOL") layers. In general, the back end of line (BEOL) is the second portion of integrated circuit fabrication where the individual devices (transistors, capacitors, resistors, etc.) are interconnected with wiring on the wafer.

The ILD 104 may be formed by depositing or growing a dielectric material, followed by a chemical mechanical polishing (CMP) or etch steps. The ILD 104 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by a planarization process, such as CMP, or any suitable etch process. In an embodiment, the ILD 104 may include one or more layers. In an embodiment, the ILD 104 may include any dielectric material such as silicon oxide (SiOx), silicon nitride (SiNx), silicon boron carbonitride (SiBCN), NBLoK, a low-k dielectric material (with k<4.0), including but not limited to, silicon oxide, spin-on-glass, a flowable oxide, a high-density plasma oxide, borophosphosilicate glass (BPSG), or any combination thereof or any other suitable dielectric material.

The lower metal wire 108 may be formed by first patterning two or more trenches (not shown) into the ILD 104, lining the two or more trenches with the liner 106, and filling the two or more openings.

The liner 106 separates the conductive interconnect material of the lower metal wire 108 from the ILD 104. The liner 106 may be composed of, for example, tantalum nitride (TaN), tantalum (Ta), titanium (Ti), titanium nitride (TiN), or a combination thereof. The liner 106 may be deposited utilizing a conventional deposition process such as, for example, CVD, plasma enhanced chemical vapor deposition (PECVD), PVD or ALD. The liner 106 may be 10 nm thick, although a thickness less than or greater than 10 nm may be acceptable. The liner 106 surround a lower horizontal surface and a vertical side surface of the lower metal wire 108.

In an embodiment, the lower metal wire 108 is formed from a conductive material layer which is blanket deposited on top of the structure 100, and directly on a top surface of the liner 106, filling the two or more trenches (not shown). The conductive material layer may include materials such as, for example copper (Cu), ruthenium (Ru), cobalt (Co), tungsten (W). The conductive material can be formed by for example, chemical vapor deposition (CVD), physical vapor deposition (PVD), and atomic layer deposition (ALD) or a combination thereof. The lower metal wire 108 is formed by damascene, or patterned from the conductive material layer, using known patterning and etching techniques.

There may be any number of openings in the ILD 104, each filled with liner 106 and the lower metal wire 108, on the structure 100.

A planarization process, such as, for example, chemical mechanical polishing (CMP), may be done to remove excess material from a top surface of the structure 100 such that upper horizontal surfaces of the lower metal wire 108, the liner 106 and the ILD 104 are coplanar.

In an embodiment, the lower metal wire 108 may have a thickness ranging from about 10 nm to about 100 nm, although a thickness less than 10 nm and greater than 100 nm may be acceptable.

Figure 2:
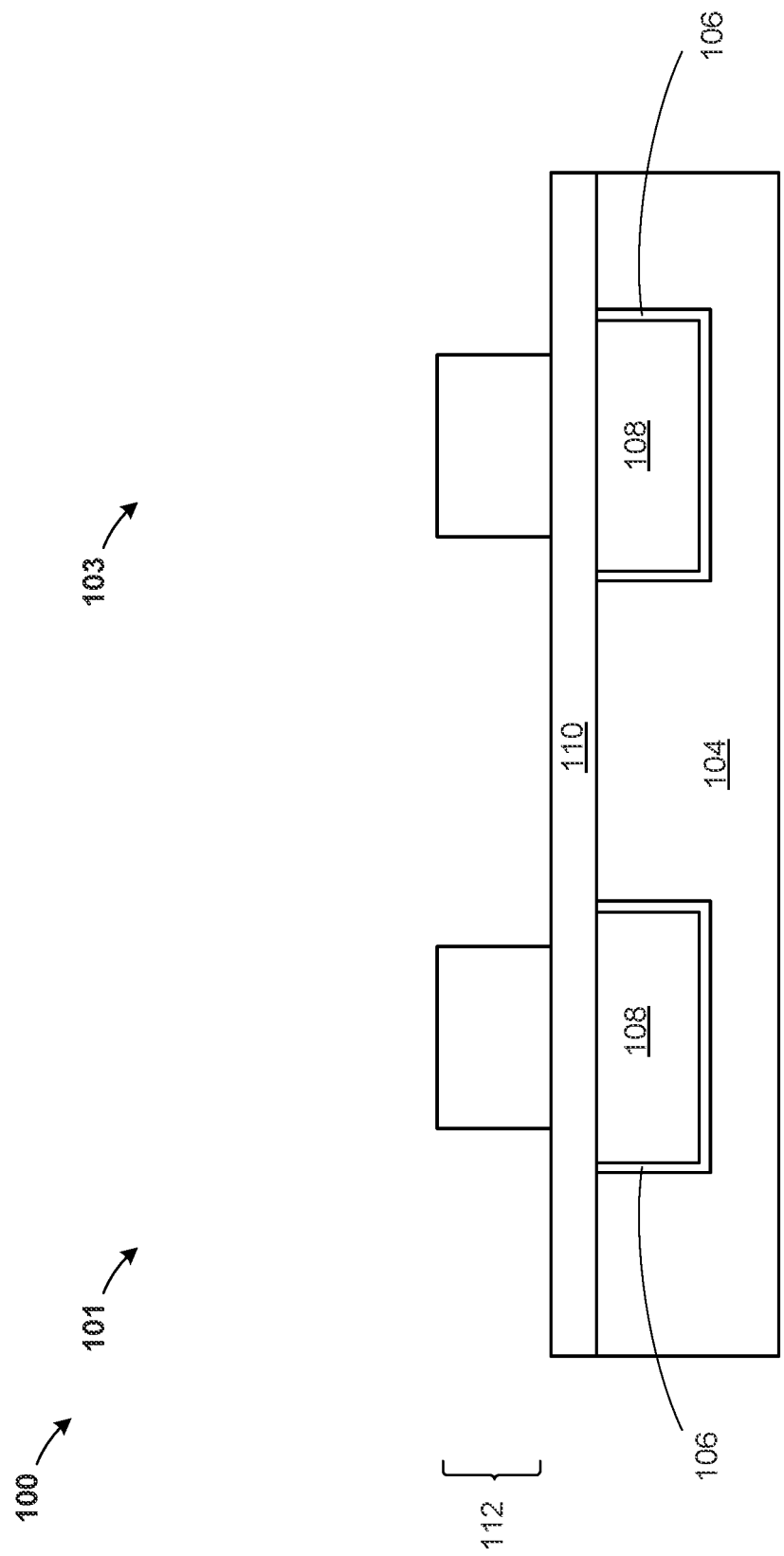
FIG. 2 illustrates a cross-sectional view of the multi-state memory cell and illustrates formation of a bottom electrode metal layer and a hard mask, according to an exemplary embodiment.

Referring now to FIG. 2, a cross-sectional view of the structure 100 is shown, according to an embodiment. A bottom electrode metal layer 110 and a hard mask 112 may be formed.

In an embodiment, the bottom electrode metal layer 110 is formed from a conductive material layer which is blanket deposited on top of the structure 100, and directly on a top surface of the liner 106, the lower metal wire 108 and the ILD 104. The conductive material layer may include materials such as, for example, tantalum nitride (TaN), tantalum (Ta), titanium (Ti), titanium nitride (TiN). The conductive material layer may be deposited using typical deposition techniques, for example, physical vapor deposition, atomic layer deposition, molecular layer deposition, and chemical vapor deposition.

The hard mask 112 may formed on the structure 100 and patterned, directly on a top surface of the bottom electrode metal layer 110.

Figure 3:
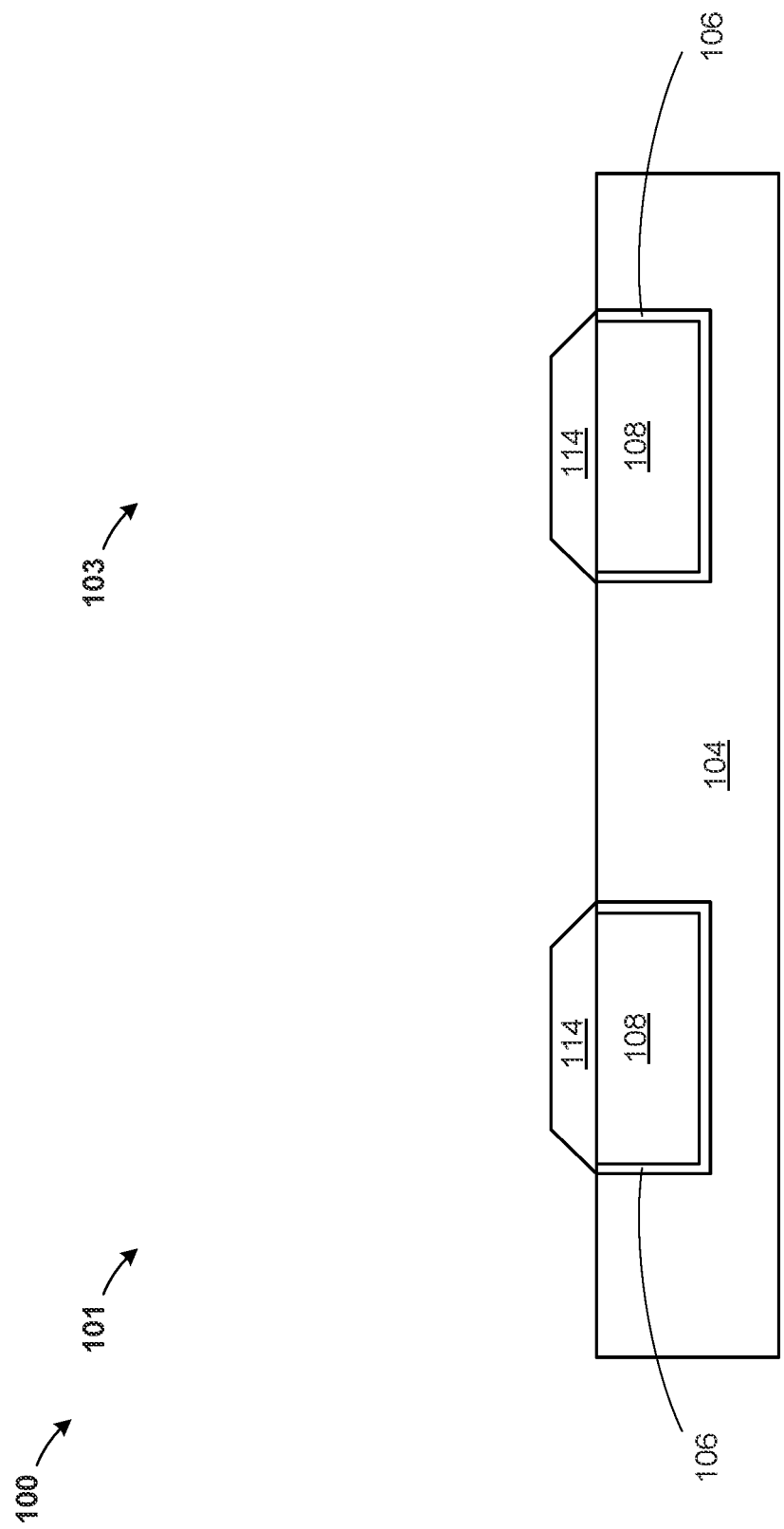
FIG. 3 illustrates a cross-sectional view of the multi-state memory cell and illustrates formation of a bottom electrode, according to an exemplary embodiment.

Referring now to FIG. 3, a cross-sectional view of the structure 100 is shown, according to an embodiment. A bottom electrode 114 may be formed in each of the cells 101, 103. The hard mask 112 may be removed.

The bottom electrode 114 may be formed from the bottom electrode metal layer 110 using the patterning of the hard mask 112. More specifically, portions of the bottom electrode metal layer 110 may be selectively removed using an anisotropic etching technique, such as, for example, reactive ion etching. In an embodiment, the bottom electrode 114 may have a thickness ranging from about 10 nm to about 100 nm, although a thickness less than 10 nm and greater than 100 nm may be acceptable. The portions of the bottom electrode metal layer 110 may be etched such that the bottom electrode 114 may have a tapered side surface, with a width of the bottom electrode 114 wider at a lower surface closer to the lower metal wire 108 and a more narrow width at an upper surface of the bottom electrode 114.

The hard mask 112 may be removed using known techniques.

Figure 4:
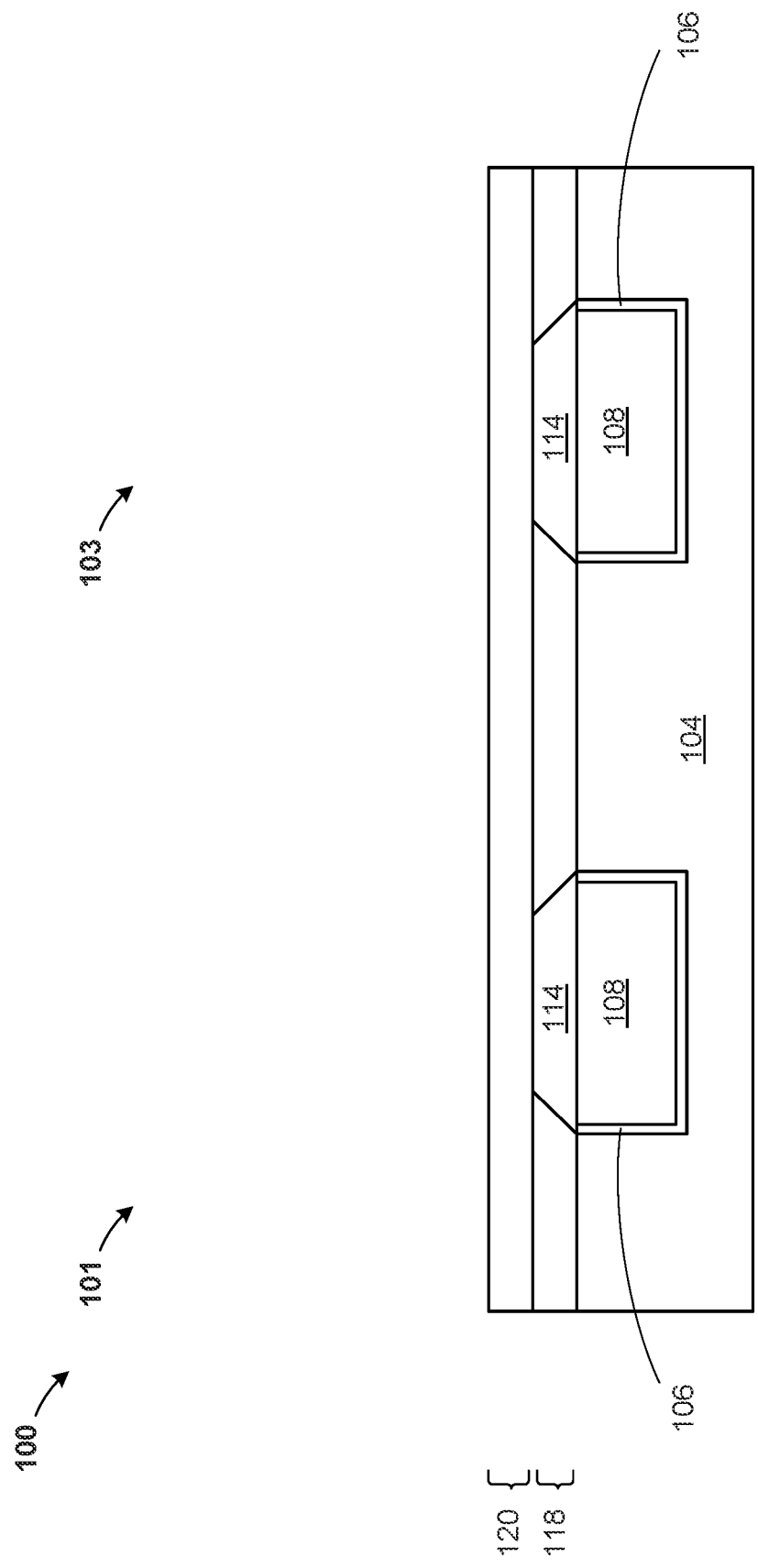
FIG. 4 illustrates a cross-sectional view of the multi-state memory cell and illustrates formation of an inter-layer dielectric, according to an exemplary embodiment.

Referring now to FIG. 4, a cross-sectional view of the structure 100 is shown, according to an embodiment. An inter-layer dielectric (hereinafter "ILD") 118 and an inter-layer dielectric (hereinafter "ILD") 120 may be formed.

The ILD 118 may surround the bottom electrode 114 of each cell 101, 103 and provide isolation between bottom electrodes 114 of adjacent cells 101, 103. The ILD 118 can be deposited across the top of the structure 100 in a blanket layer on the ILD 104. The ILD 118 may be formed as described for the ILD 104. A chemical mechanical planarization technique may optionally be used to polish the ILD 118 and provide a substantially smooth and uniform surface in preparation for subsequent processing techniques.

The ILD 120 can be deposited across the top of the structure 100 in a blanket layer on the bottom electrode 114 and the ILD 118. The ILD 120 may be formed, as described for the ILD 104. A chemical mechanical planarization technique may optionally be used to polish the ILD 120 and provide a substantially smooth and uniform surface in preparation for subsequent processing techniques. The ILD 118 and the ILD 120 may be formed of the same material or of different materials.

Figure 5:
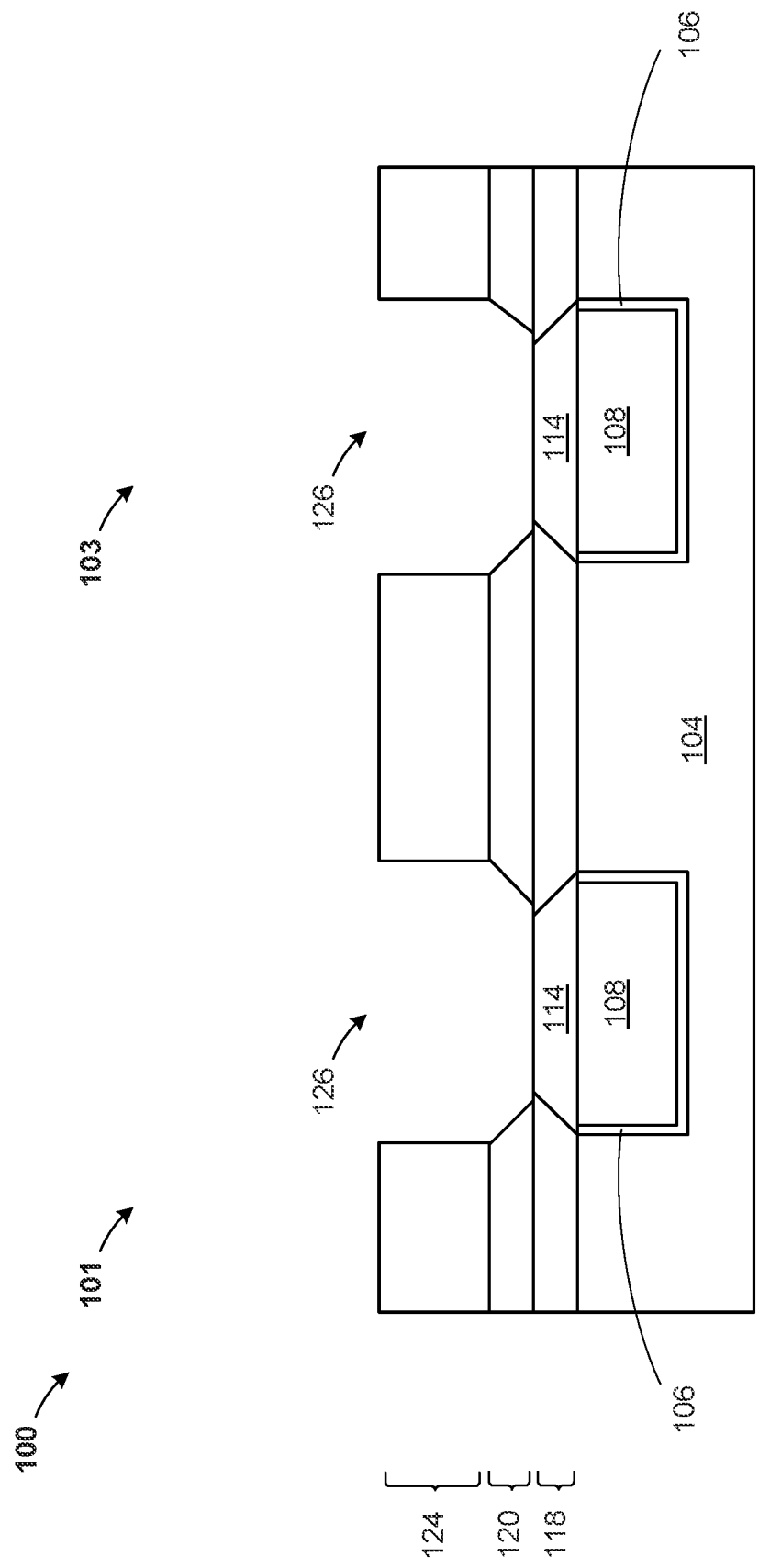
FIG. 5 illustrates a cross-sectional view of the multi-state memory cell and illustrates formation of an opening, according to an exemplary embodiment.

Referring now to FIG. 5, a cross-sectional view of the structure 100 is shown, according to an embodiment. A hard mask 124 may be formed. Openings 126 may be formed in the ILD 120.

The hard mask 124 may formed on the structure 100 and patterned, directly on a top surface of the ILD 120. Portions of the ILD 120 may be selectively removed using an anisotropic etching technique, such as, for example, reactive ion etching, forming the openings 126. The portions of the ILD 120 may be etched such that the ILD 120 may have a tapered side surface, with a width of the opening 126 more narrow at a lower surface closer to the bottom electrode 114 and a width more width at an upper surface of the opening 126. There may be two or more openings 126, each of which may be vertically aligned with the bottom electrode 114 of each of the cells 101, 103. The openings 126 may expose an upper surface of the bottom electrode 114 and a portion of an upper surface of the ILD 120.

Figure 6:
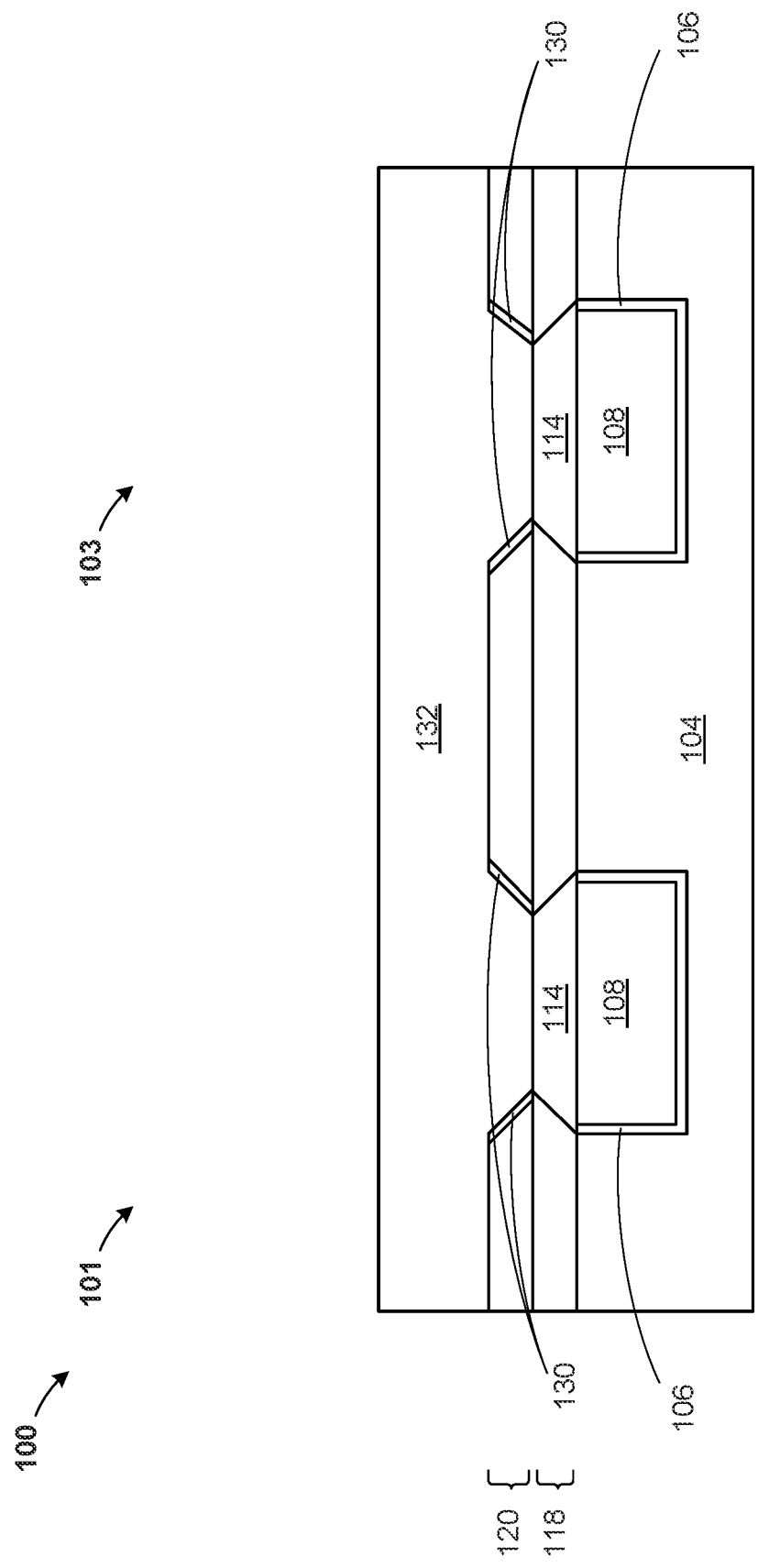
FIG. 6 illustrates a cross-sectional view of the multi-state memory cell and illustrates formation of a liner and formation of a reference layer, according to an exemplary embodiment.

Referring now to FIG. 6, a cross-sectional view of the structure 100 is shown, according to an embodiment. The hard mask 124 may be removed. A liner 130 and a reference layer 132 may be formed.

The hard mask 124 may be removed by conventional processes.

The liner 130 can be formed by a conformal dielectric material deposition on the ILD 120, the ILD 118 and the bottom electrode 114. The liner 130 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. The liner 130 may include any dielectric material such as silicon nitride (SiN), silicon boron carbon nitride (SiBCN), silicon oxide carbon nitride (SiOCN), aluminum oxide (AlOx), SiC, and may include a single layer or may include multiple layers of dielectric material. An anisotropic process, such as reactive ion etch (RIE) or ion beam etch (IBE), may be used to remove the liner 130 from horizontal surfaces of the ILD 120 and the bottom electrode 114. As a result, the liner 130 may remain on vertical side surfaces of the ILD 120.

The reference layer 132 may be formed conformally on the structure 100. The reference layer 132 may cover an upper surface of the ILD 120, an upper surface of the bottom electrode 114, and an upper surface and a vertical side surface of the liner 130.

Figure 7:
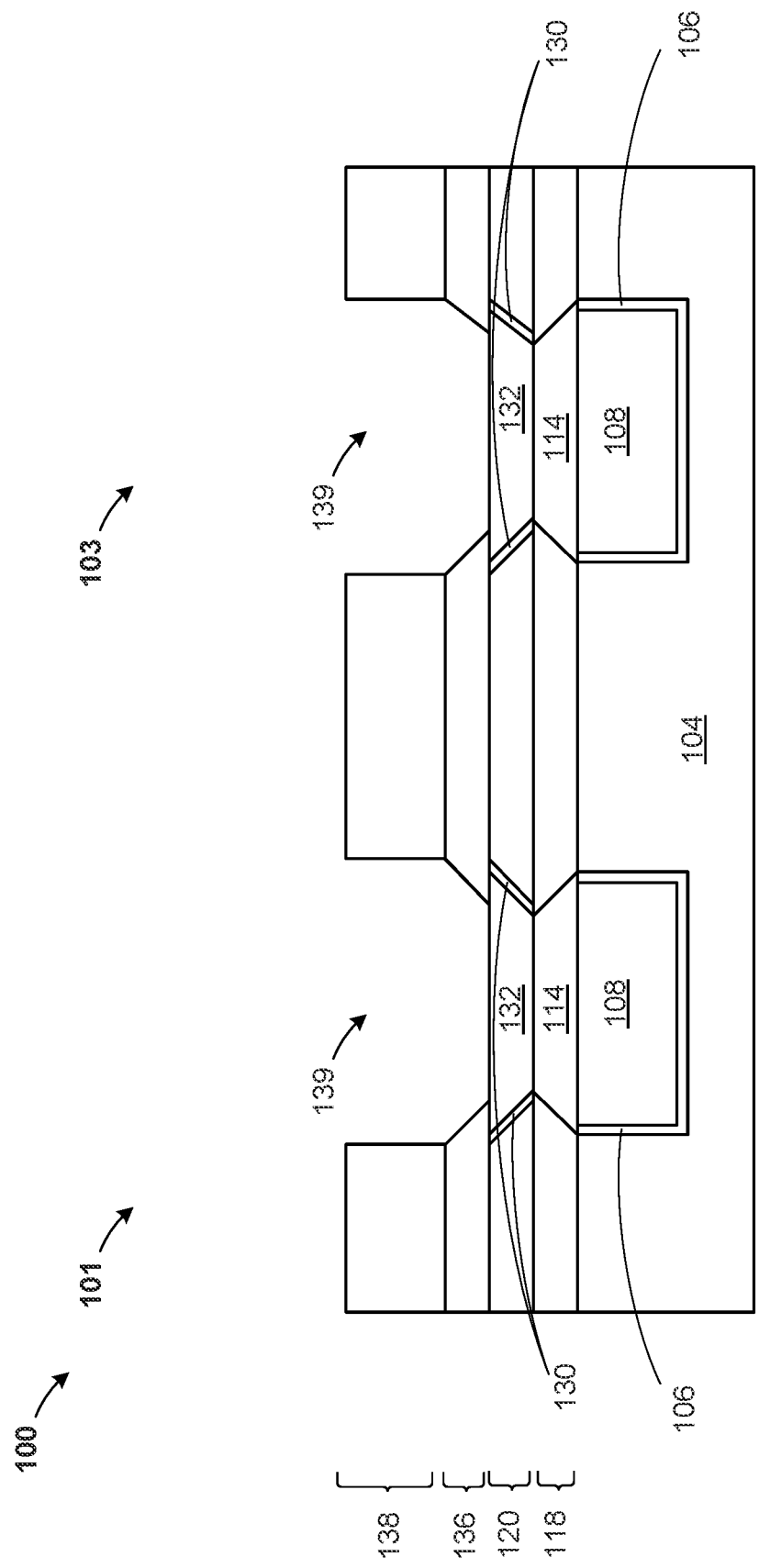
FIG. 7 illustrates a cross-sectional view of the multi-state memory cell and illustrates formation of an inter-layer dielectric, according to an exemplary embodiment.

Referring now to FIG. 7, a cross-sectional view of the structure 100 is shown, according to an embodiment. Portions of the reference layer 132 may be removed. An inter-layer dielectric (hereinafter "ILD") 136 may be formed. A hard mask 138 may be formed.

A planarization process, such as, for example, chemical mechanical polishing (CMP), may be done to remove excess reference layer 132 material from a top surface of the ILD 120 of the structure 100, such that upper horizontal surfaces of the reference layer 132, the liner 130 and the ILD 120 are coplanar.

The ILD 136 may be formed as described for the ILD 104 and formed on the ILD 120, the liner 130 and the reference layer 132.

A hard mask 138 may be formed on the ILD 136 and may have openings 139. A combination of wet/dry patterning may remove portions of the ILD 136 in the openings 139, selective to the reference layer 132, exposing an upper horizontal surface of the reference layer 132. The openings 139 may be vertically aligned with the reference layer 132, the bottom electrode 114 and the lower metal wire 108.

A tapered side surface of the reference layer 132 is wider at an upper surface further from the ILD 104, compared to a lower surface closer to the ILD 104.

Figure 8:
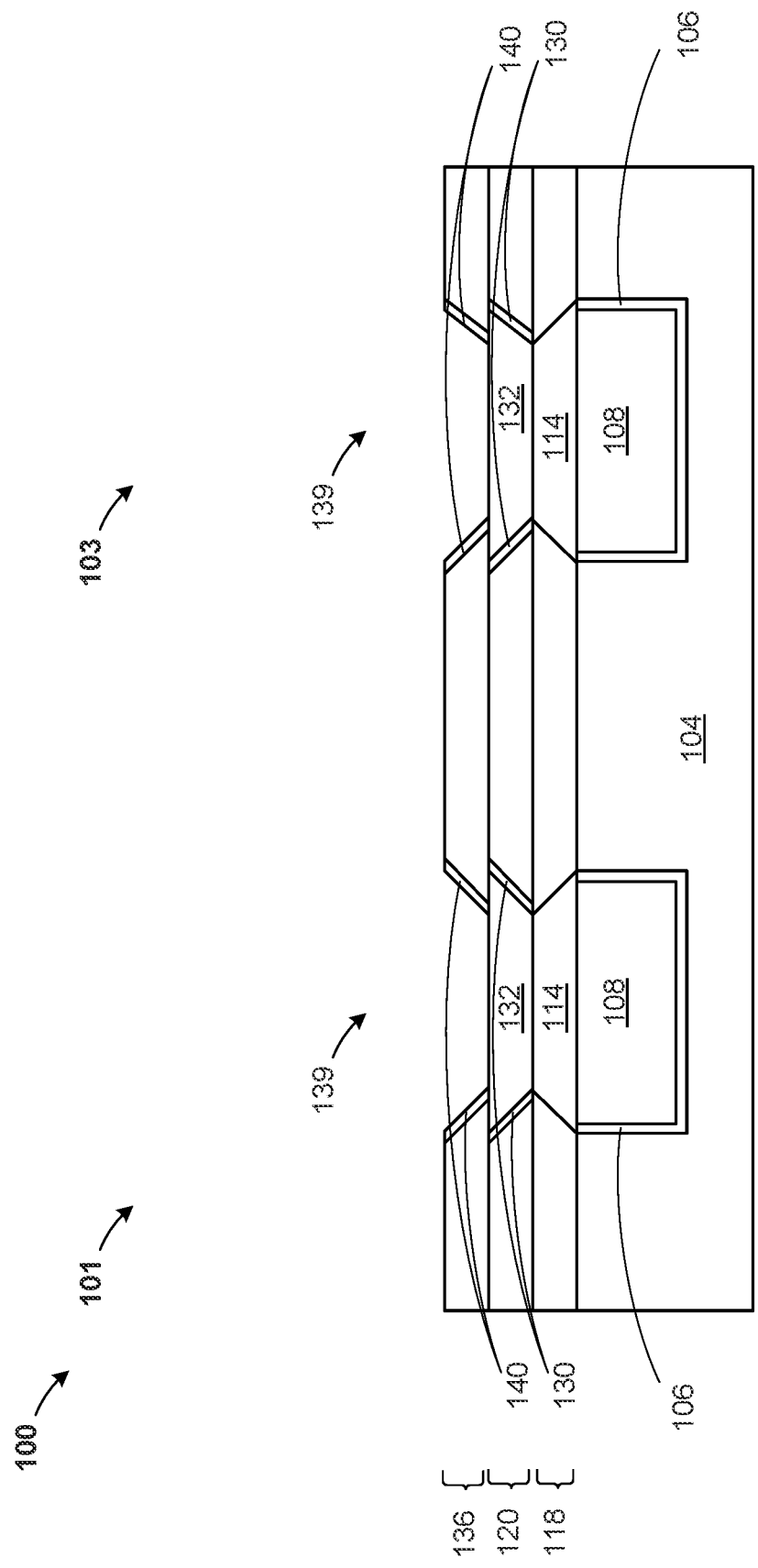
FIG. 8 illustrates a cross-sectional view of the multi-state memory cell and illustrates formation of a liner, according to an exemplary embodiment.

Referring now to FIG. 8, a cross-sectional view of the structure 100 is shown, according to an embodiment. The hard mask 138 may be removed and a liner 140 may be formed.

The hard mask 138 may be removed by methods known in the arts.

The liner 140 may be formed on vertical side surfaces of the ILD 136. The liner 140 may be formed as described for the liner 130. The liner 130 may have a horizontal lower surface adjacent to an upper surface of the ILD 118 and an upper surface of the bottom electrode 114.

The liner 140 can be formed by a conformal dielectric material deposition on the ILD 136 and the reference layer 132. The liner 140 may be formed as described for the liner 130. An anisotropic process, such as reactive ion etch (RIE) or ion beam etch (IBE), may be used to remove the liner 140 from horizontal surfaces of the ILD 136 and the reference layer 132. As a result, the liner 140 may remain on vertical side surfaces of the ILD 136.

Figure 9:
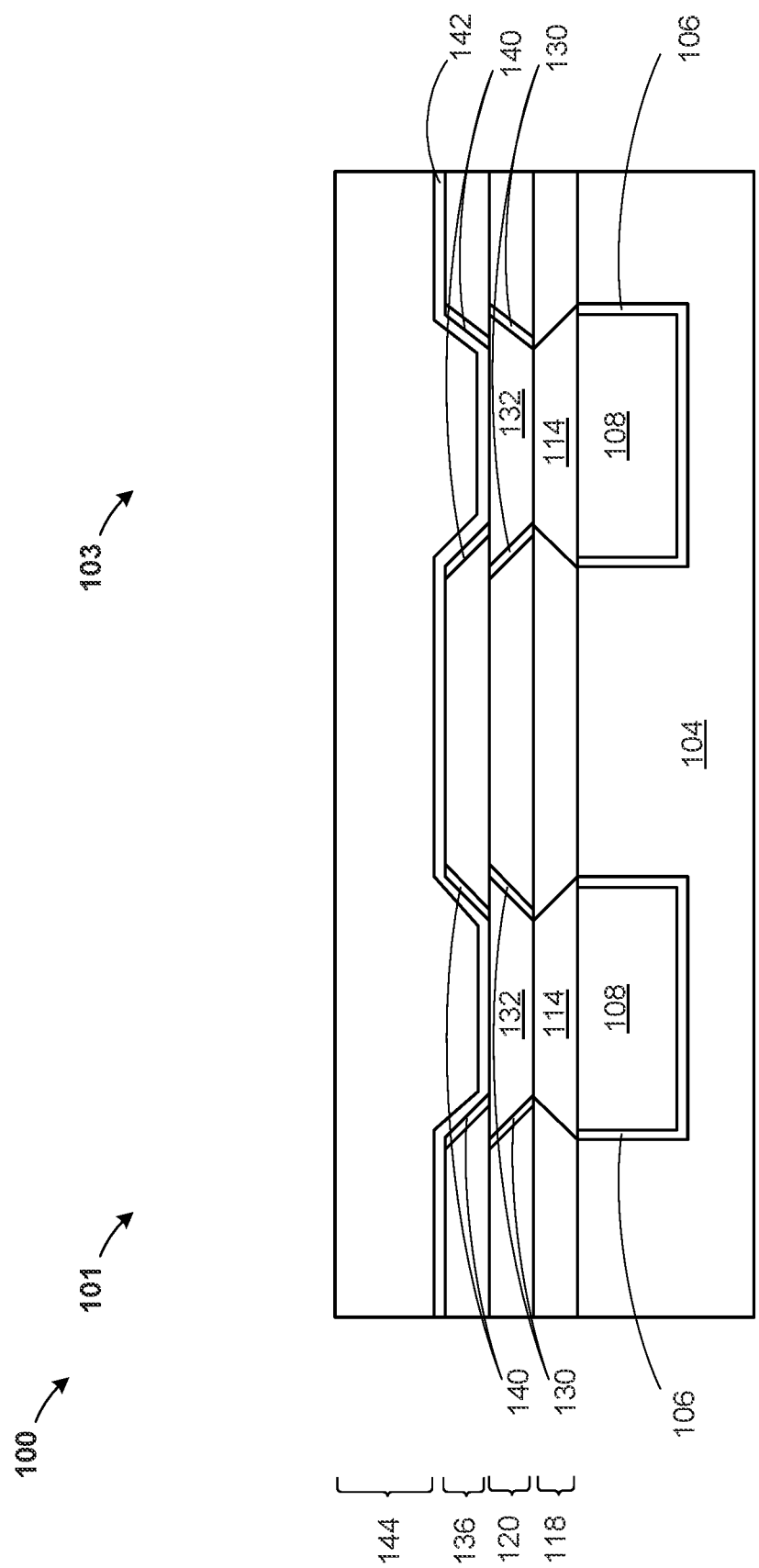
FIG. 9 illustrates a cross-sectional view of the multi-state memory cell and illustrates formation of a tunneling barrier and a free layer, according to an exemplary embodiment.

Referring now to FIG. 9, a cross-sectional view of the structure 100 is shown, according to an embodiment. A tunneling barrier 142 and a free layer 144 may be formed.

The tunneling barrier 142 may be formed conformally on the structure 100, filling a portion of the openings 139, adjacent to horizontal surfaces of the ILD 136 and the reference layer 132 and adjacent to vertical surfaces of the liner 140.

The free layer 144 may be formed conformally on the structure 100, filing a remaining portion of the openings 139, above the tunneling barrier 142.

Figure 10:
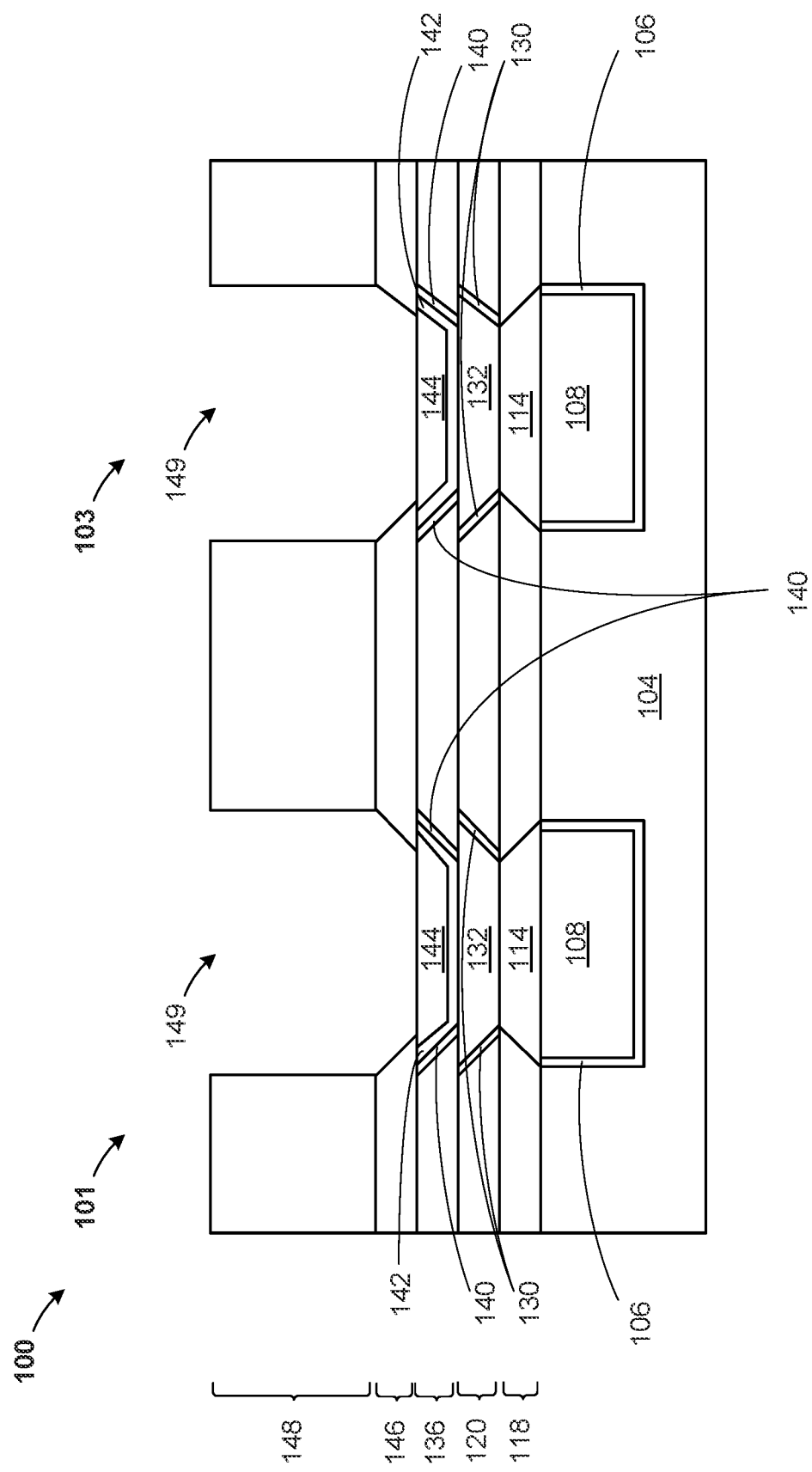
FIG. 10 illustrates a cross-sectional view of the multi-state memory cell and illustrates formation of an inter-layer dielectric, according to an exemplary embodiment.

Referring now to FIG. 10, a cross-sectional view of the structure 100 is shown, according to an embodiment. Portions of the tunneling barrier 142 and portions of the free layer 144 may be removed. An inter-layer dielectric (hereinafter "ILD") 146 may be formed. A hard mask 148 may be formed. An opening 149 may be formed.

A planarization process, such as, for example, chemical mechanical polishing (CMP), may be done to remove excess tunneling barrier 142 material and excess free layer 144 material from a top surface of the ILD 136 of the structure 100, such that upper horizontal surfaces of the tunneling barrier 142, the free layer 144, the liner 140 and the ILD 136 are coplanar.

The ILD 146 may be deposited as described for the ILD 104 and formed on the ILD 136, tunneling barrier 142, the free layer 144 and the liner 140.

A hard mask 138 may be formed on the ILD 146 and may have openings 149. A combination of wet/dry patterning may remove portions of the ILD 146 in the openings 149, selective to the free layer 144, exposing an upper horizontal surface of the free layer 144. The openings 149 may be vertically aligned with the free layer 144, the reference layer 132, the bottom electrode 114 and the lower metal wire 108.

A tapered side surface of the free layer 144 is wider at an upper surface further from the ILD 104, compared to a lower surface closer to the ILD 104.

Figure 11:
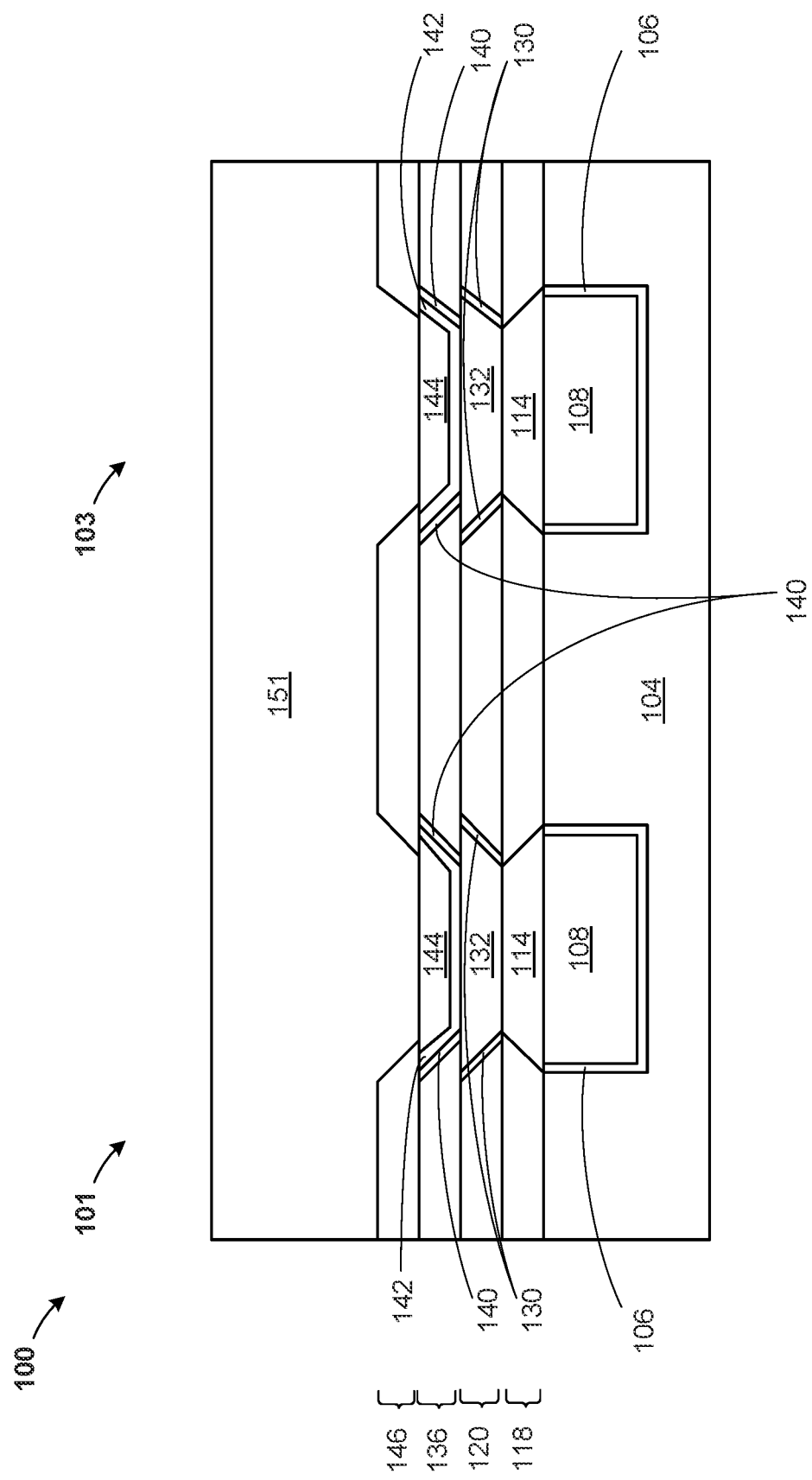
FIG. 11 illustrates a cross-sectional view of the multi-state memory cell and illustrates formation of a top electrode metal layer, according to an exemplary embodiment.

Referring now to FIG. 11, a cross-sectional view of the structure 100 is shown, according to an embodiment. The hard mask 148 may be removed. A top electrode metal layer 151 may be formed.

In an embodiment, the top electrode metal layer 151 is formed from a conductive material layer which is blanket deposited on top of the structure 100, and directly on a top surface of the ILD 146 and the free layer 144. The conductive material layer may include materials such as, for example, tantalum nitride (TaN), tantalum (Ta), titanium (Ti), titanium nitride (TiN). The conductive material layer may be deposited using typical deposition techniques, for example, physical vapor deposition, atomic layer deposition, molecular layer deposition, and chemical vapor deposition.

Figure 12:
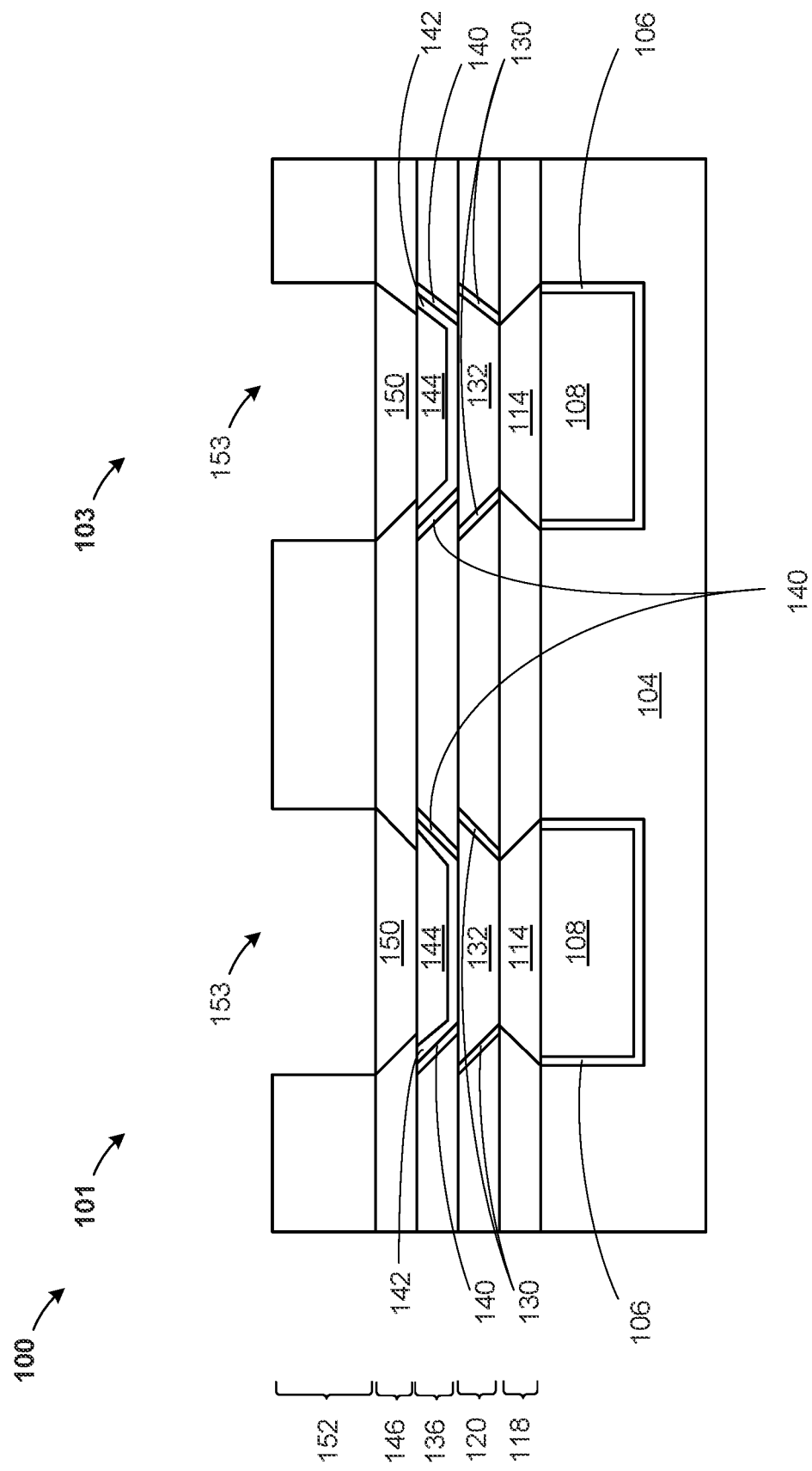
FIG. 12 illustrates a cross-sectional view of the multi-state memory cell and illustrates formation of a top electrode, according to an exemplary embodiment.

Referring now to FIG. 12, a cross-sectional view of the structure 100 is shown, according to an embodiment. Portions of the top electrode metal layer 151 may be removed, forming the top electrode 150 and an inter-layer dielectric (hereinafter "ILD") 152 may be formed.

A planarization process, such as, for example, chemical mechanical polishing (CMP), may be done to remove excess top electrode metal layer 151 from a top surface of the ILD 146 of the structure 100, forming the top electrode 150. Upper horizontal surfaces of the top electrode 150 and the ILD 146 may be coplanar.

The ILD 152 may be deposited as described for the ILD 104, on the ILD 146 and the top electrode 150. A hard mask (not shown) may be formed on the ILD 152 and a combination of wet/dry patterning may remove portions of the ILD 146 to form openings 153.

A tapered side surface of the top electrode 150 is wider at an upper surface further from the ILD 104, compared to a lower surface closer to the ILD 104.

Figure 13:
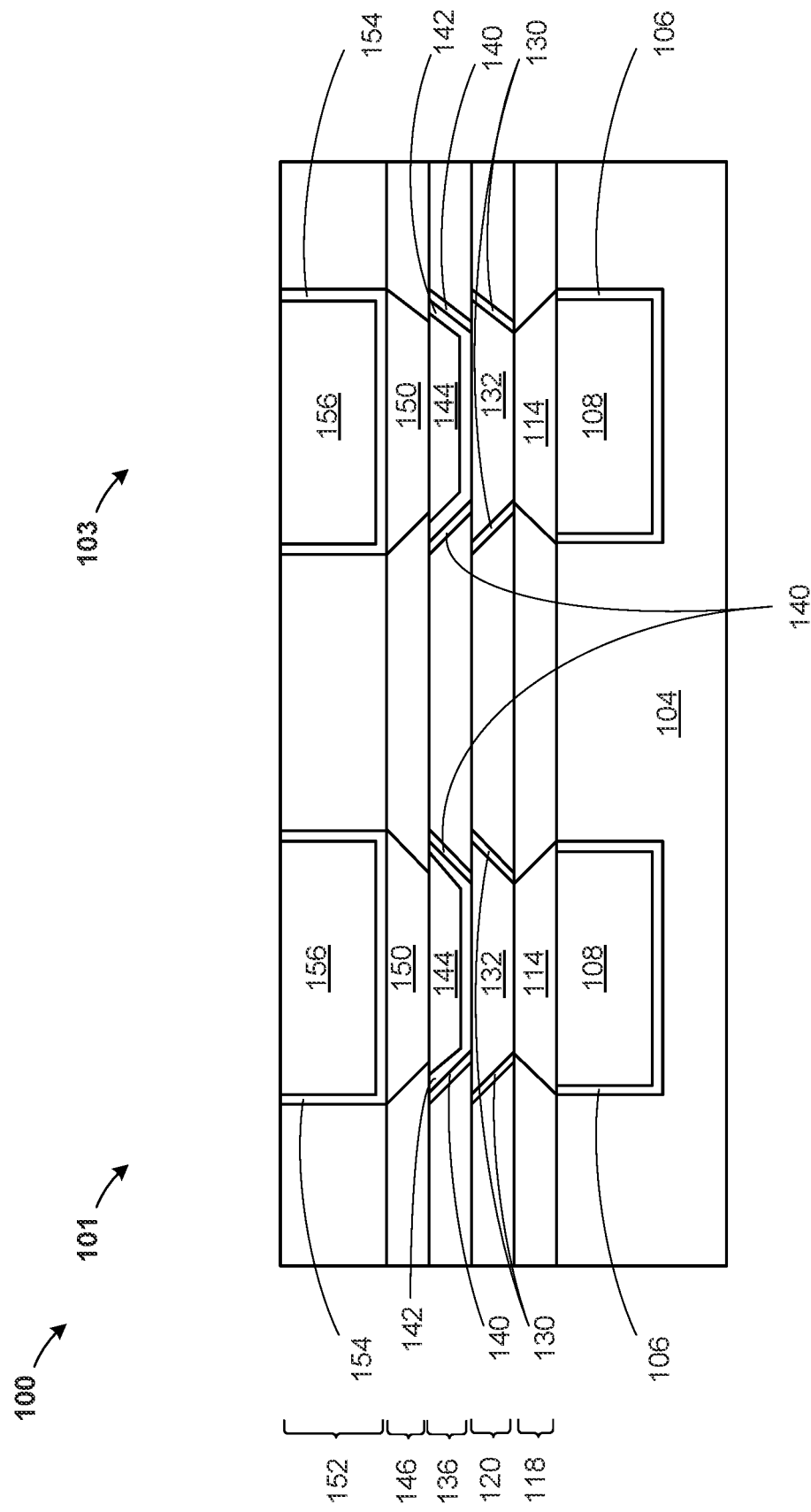
FIG. 13 illustrates a cross-sectional view of the multi-state memory cell and illustrates formation of an upper metal wire, according to an exemplary embodiment.

Referring now to FIG. 13, a cross-sectional view of the structure 100 is shown, according to an embodiment. A liner 154 and an upper metal wire 156 may be formed.

The upper metal wire 156 may be formed by lining the openings 153 with the liner 154, and filling a portion of the openings 153. The liner 154 separates the conductive interconnect material of the upper metal wire 156 from the ILD 152. The liner 154 may be formed as described for the liner 106. The liner 154 surround a lower horizontal surface and a vertical side surface of the upper metal wire 156.

The upper metal wire 156 may be formed as described for the lower metal wire 108. There may be any number of openings 153 in the ILD 152, each filled with the liner 154 and the upper metal wire 156, on the structure 100, for each cell, such as cells 101, 103.

A planarization process, such as, for example, chemical mechanical polishing (CMP), may be done to remove excess material from a top surface of the structure 100 such that upper horizontal surfaces of the upper metal wire 156, the liner 154 and the ILD 152 are coplanar.

As shown in the Figures, two cells 101, 103 are formed, however any number of MTJ cells may be formed.

The structure 100 has vertically aligned portions of the MTJ stack, including the bottom electrode 114, the reference layer 132, the free layer 144 and the top electrode 150. The MTJ stack is vertically aligned between the lower metal wire 108 and the upper metal wire 156. The edges of each of the bottom electrode 114, the reference layer 132, the free layer 144 and the top electrode 150 have been individually formed and proportioned to each cell 101, 103, and each layer individually has tapered vertical side surfaces. The bottom electrode 114 has a tapered vertical side surface more narrow at an upper surface compared to a lower surface. The reference layer 132, the free layer 144 and the top electrode 150 each have a tapered vertical side surface more wide at an upper surface compared to a lower surface. The resulting side surface of the MTJ stack is a saw tooth type side surface.

Additionally, the structure 100 has inter-layer dielectric layers formed separately surrounding each of the layers of the bottom electrode 114, the reference layer 132, the tunneling barrier 142, the free layer 144 and the top electrode 150. Each of the ILDs 118, 120, 136, 146 are formed individually and have less voiding of an inter-layer dielectric formed at one time for a same total volume of ILD for the entire MTJ stack, for each cell 101, 103.

Figure 14:
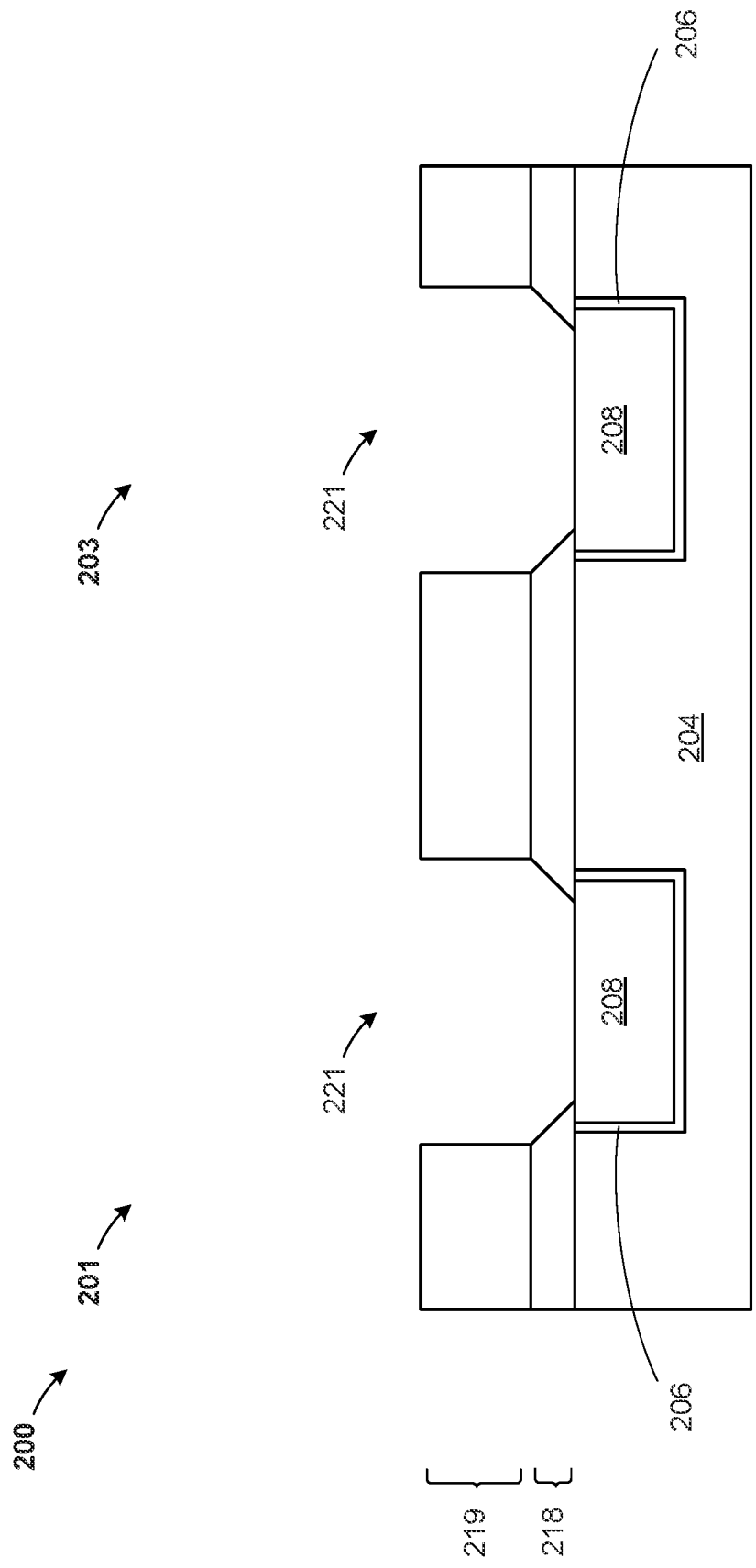
FIG. 14 illustrates a cross-sectional view of a multi-state memory cell, according to another exemplary embodiment.

Referring now to FIG. 14, a cross-sectional view of a structure 200 is shown, according to an alternate embodiment. The structure 200 may be formed or provided and may include an inter-layer dielectric (hereinafter "ILD") 204, a liner 206, a lower metal wire 208, an inter-layer dielectric (hereinafter "ILD") 218 and a hard mask 219. The structure 200 may include a cell 201 and a cell 203. Items of the structure 200 may be formed as described for similarly named items of the structure 100, unless described otherwise.

In comparison of the structure 200 to the structure 100, an alternate method is provided for formation of a bottom electrode.

The structure 200 may include several back end of line ("BEOL") layers. In general, the back end of line (BEOL) is the second portion of integrated circuit fabrication where the individual devices (transistors, capacitors, resistors, etc.) are interconnected with wiring on the wafer.

The ILD 204 may be formed on the structure 200 as described for the ILD 104. The ILD 218 may be formed on the structure 200 as described for the ILD 118, covering the ILD 204, the lower metal wire 208 and the liner 206. Openings 221 may be formed in the ILD 218 using convention methods, such as patterning a hard mask (not shown) and using a combination of wet/dry etch techniques to remove portions of the ILD 218 which align with the lower metal wire 208 of each of the cells 201, 203.

Figure 15:
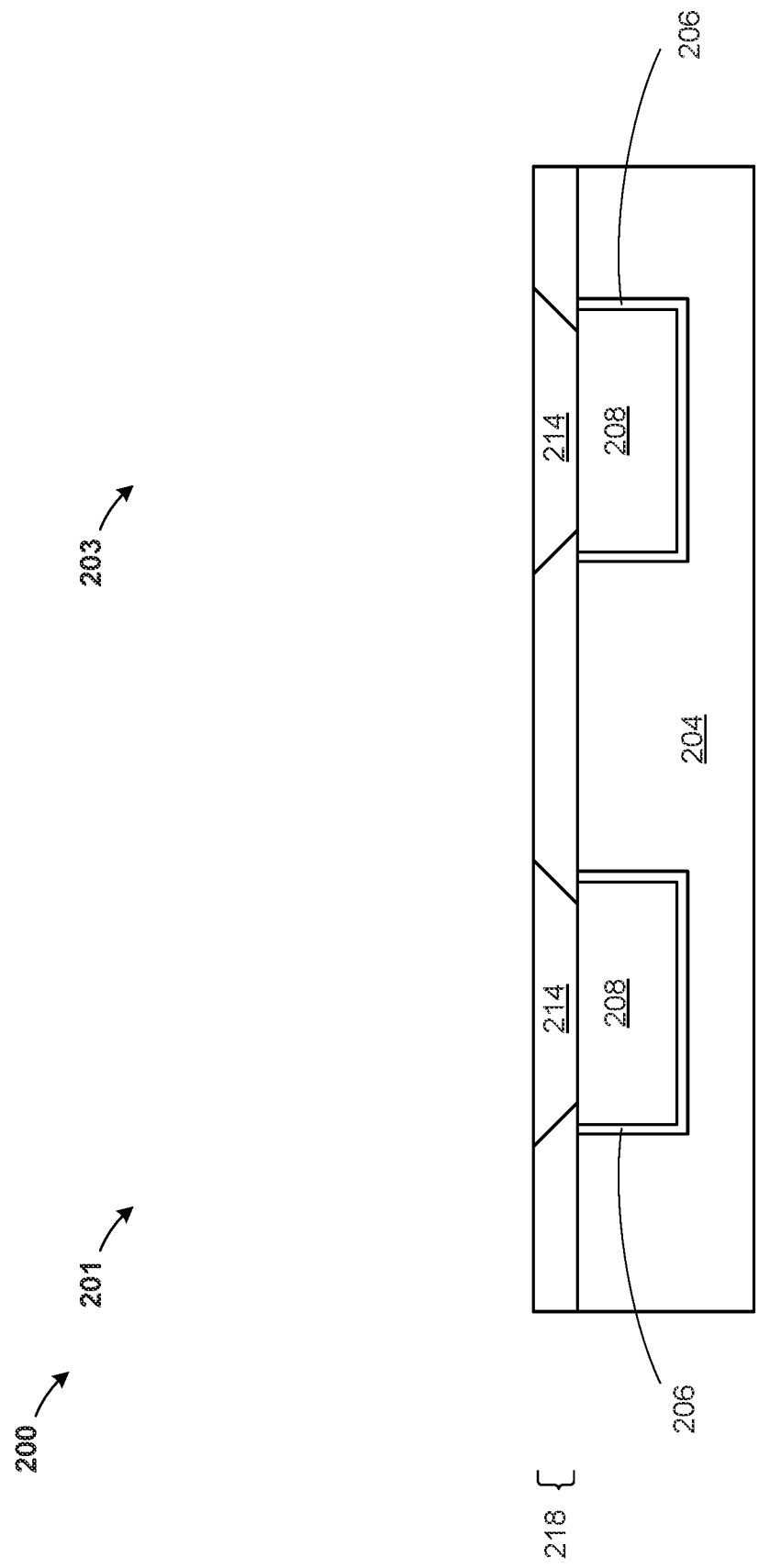
FIG. 15 illustrates a cross-sectional view of the multi-state memory cell and illustrates formation of a bottom electrode, according to an exemplary embodiment.

Referring now to FIG. 15, a cross-sectional view of the structure 200 is shown, according to an embodiment. A bottom electrode 214 may be formed. The hard mask 219 may be removed.

In an embodiment, the bottom electrode 214 is formed from a conductive material layer which is deposited on top of the structure 200, filling the opening 221 on the lower metal wire 208. The conductive material layer may include materials such as, for example, tantalum nitride (TaN), tantalum (Ta), titanium (Ti), titanium nitride (TiN). The conductive material layer may be deposited using typical deposition techniques, for example, physical vapor deposition, atomic layer deposition, molecular layer deposition, and chemical vapor deposition.

A planarization process, such as, for example, chemical mechanical polishing (CMP), may be done to remove excess material and the hard mask 219 from a top surface of the structure 200 such that upper horizontal surfaces of the bottom electrode 214 and the ILD 218 are coplanar.

Figure 16:
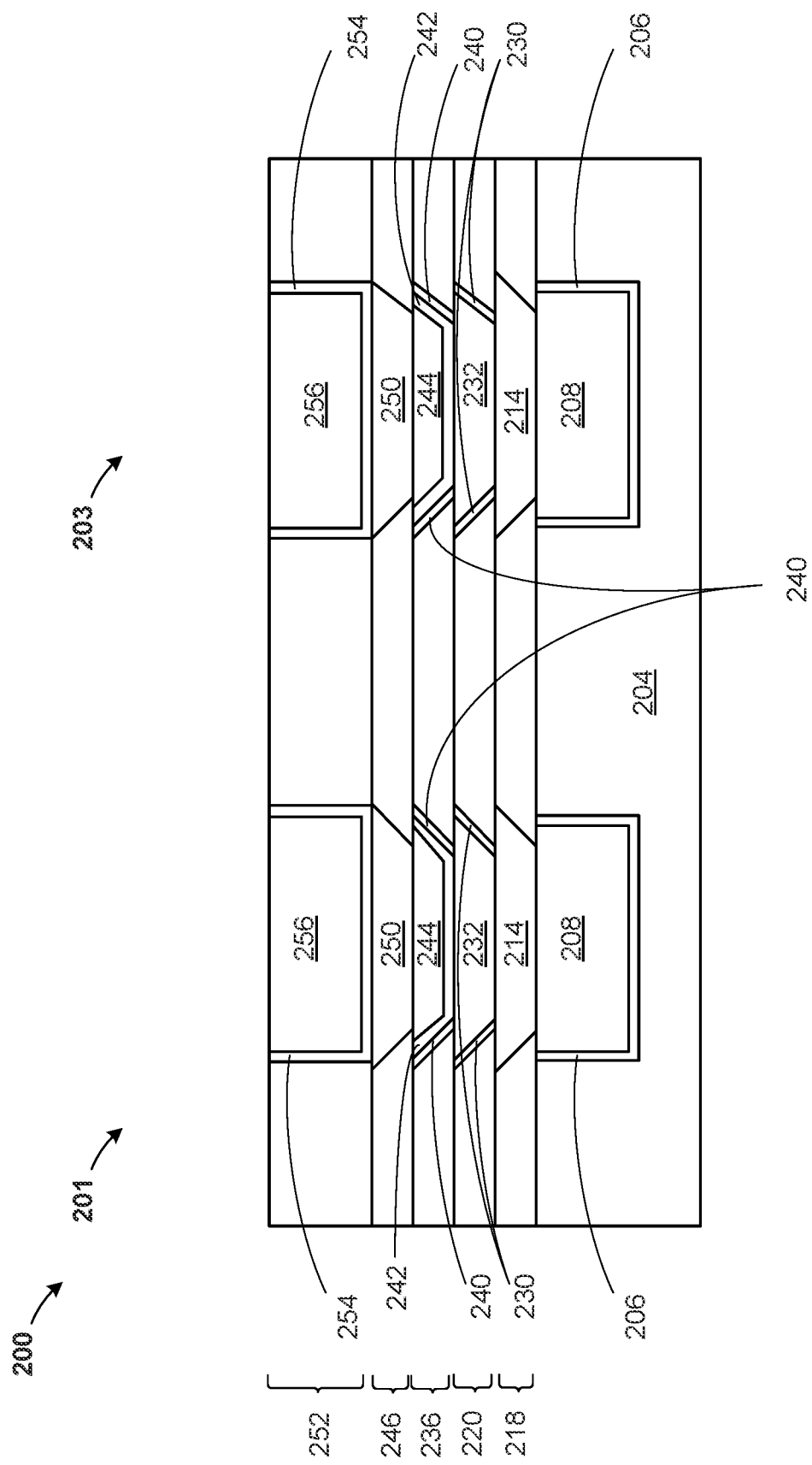
FIG. 16 illustrates a cross-sectional view of the multi-state memory cell and illustrates formation of a reference layer, a tunneling barrier, a free layer, a top electrode and an upper metal wire, according to an exemplary embodiment.

Referring now to FIG. 16, a cross-sectional view of the structure 200 is shown, according to an embodiment. Remaining portions of the structure 200 may be formed as described for the structure 100.

The remaining portions of the structure 200 include the following. An inter-layer dielectric (hereinafter "ILD") 220 may be formed on the ILD 218 and the bottom electrode 214. Openings (not shown) may be formed in the ILD 218. A liner 230 may be formed on vertical side surfaces of the openings (not shown) in the ILD 218. A reference layer 232 may be filled in remaining portions of the openings (not shown) in the ILD 218. An ILD 236 may be formed on the ILD 220, the liner 230 and the reference layer 232. Openings (not shown) may be formed in the ILD 236. A liner 240 may be formed on vertical side surfaces of the openings (not shown) in the ILD 236. A tunneling barrier 242 may be formed on vertical side surfaces of the liner 240 and on a horizontal lower surface of the reference layer 232. A free layer 244 may be formed in a remaining portion of the openings (not shown) in the ILD 236. An ILD 246 may be formed on the free layer 244, the tunneling barrier 242 and the liner 240. Openings (not shown) may be formed in the ILD 246. A top electrode 250 may be formed in the openings (not shown) of the ILD 246. An ILD 252 may be formed on the top electrode 250 and the ILD 246. Openings (not shown) may be formed in the ILD 252. A liner 254 may be formed on vertical side surfaces and on a lower horizontal surface of the openings (not shown) of the ILD 252. An upper metal wire 256 may be formed in a remaining portion of the openings (not shown) of the ILD 252.

As shown in the Figures, two cells 201, 203 are formed, however any number of MTJ cells may be formed.

The structure 200 has the bottom electrode 214 which has been formed differently and has a different shape than the bottom electrode 114 of the structure 100. In the structure 100, the material of the bottom electrode 114 is formed on the ILD 104, the lower metal wire 108 and the liner 106, and then portions of the bottom electrode material are removed, and remaining portions become the bottom electrode 114. An ILD 118 is formed surrounding the bottom electrode 114. The resulting bottom electrode 114 has a width at a lower portion of the bottom electrode 114 which is wider than a width of a higher portion of the bottom electrode 114, as compared as a distance from the ILD 104. In comparison, the bottom electrode 214 is formed in an opening 221 of the ILD 218. The bottom electrode 214 has a width at a lower portion of the bottom electrode 214 which is more narrow than a width of a higher portion of the bottom electrode 214, as compared as a distance from the ILD 204.

The structure 200 has vertically aligned portions of the MTJ stack, including the bottom electrode 214, the reference layer 232, the tunneling barrier 242, the free layer 244 and the top electrode 250. The MTJ stack is vertically aligned between the lower metal wire 208 and the upper metal wire 256. The edges of each of the bottom electrode 214, the reference layer 232, the free layer 244 and the top electrode 250 have been individually formed and proportioned to each cell 201, 203, and each layer individually has tapered vertical side surfaces. The bottom electrode 214 has a tapered vertical side surface more narrow at a lower surface compared to an upper surface. The reference layer 232, the free layer 244 and the top electrode 1250 each have a tapered vertical side surface more wide at an upper surface compared to a lower surface. The resulting side surface of the MTJ stack is a saw tooth type side surface.

Additionally, the structure 200 has inter-layer dielectric layers formed separately surrounding each of the layers of the bottom electrode 214, the reference layer 232, the free layer 244 and the top electrode 250. Each of the ILDs 218, 220, 236, 246 are formed individually and have less voiding of an inter-layer dielectric formed at one time for a same total volume of ILD for the entire MTJ stack, for each cell 201, 203.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:
   a magnetic tunnel junction (MTJ) stack, wherein a vertical side surface of the MTJ stack comprises a saw tooth edge, wherein a tunnel barrier layer of the MTJ stack includes a horizontal section and an angled vertical section;
   a dielectric layer located around the MTJ stack; and
   a liner located between the angled vertical section of the tunnel barrier layer and the dielectric layer.

2. The semiconductor device according to claim 1, further comprising:
   the MTJ stack comprises vertically aligned layers of a top electrode, a free layer, a tunneling barrier, a reference layer and a bottom electrode.

3. The semiconductor device according to claim 2, further comprising:
   the free layer of the MTJ stack has a tapered edge comprising a first width at an upper portion of the free layer and a second width at a lower portion of the free layer,
   wherein the first width is greater than the second width.

4. The semiconductor device according to claim 3, wherein
   the reference layer of the MTJ stack has a tapered edge comprising a third width at an upper portion of the reference layer and a fourth width at a lower portion of the reference layer,
   wherein the third width is greater than the second width.

5. The semiconductor device according to claim 3, wherein
   the tunneling barrier of the MTJ stack has a tapered edge comprising a third width at an upper portion of the tunneling barrier and a fourth width at a lower portion of the tunneling barrier,
   wherein the third width is greater than the second width.

6. The semiconductor device according to claim 3, wherein
   the bottom electrode of the MTJ stack has a tapered edge comprising a third width at an upper portion of the bottom electrode and a fourth width at a lower portion of the bottom electrode,
   wherein the third width is greater than the second width.

7. The semiconductor device according to claim 3, wherein
   the bottom electrode of the MTJ stack has a tapered edge comprising a third width at an upper portion of the bottom electrode and a fourth width at a lower portion of the bottom electrode,
   wherein the third width is less than the second width.

8. The semiconductor device according to claim 3, wherein
   the bottom electrode of the MTJ stack has a tapered edge comprising a third width at an upper portion of the bottom electrode and a fourth width at a lower portion of the bottom electrode,
   the top electrode of the MTJ stack has a tapered edge comprising a fifth width at an upper portion of the top electrode and a sixth width at a lower portion of the top electrode,
   wherein the third width is greater than the sixth width.

9. A semiconductor device comprising:
   a magnetic tunnel junction (MTJ) stack, wherein
   a vertical side surface of the MTJ stack comprises a saw tooth edge,
   the MTJ stack comprises vertically aligned layers of a top electrode, a free layer, a tunneling barrier, a reference layer and a bottom electrode, wherein the free layer of the MTJ stack has a tapered edge comprising a first width at an upper portion of the free layer and a second width at a lower portion of the free layer, wherein the first width is greater than the second width, wherein the tunnel barrier layer of the MTJ stack includes a horizontal section and an angled vertical section, wherein the bottom electrode includes at least one angled side wall, wherein the at least one angled side wall of the bottom electrode is angled towards the reference layer located on top of the bottom electrode.

10. The semiconductor device according to claim 9, wherein the reference layer of the MTJ stack has a tapered edge comprising a third width at an upper portion of the reference layer and a fourth width at a lower portion of the reference layer, wherein the third width is greater than the second width.

11. The semiconductor device according to claim 9, wherein the tunneling barrier of the MTJ stack has a tapered edge comprising a third width at an upper portion of the tunneling barrier and a fourth width at a lower portion of the tunneling barrier, wherein the third width is greater than the second width.

12. The semiconductor device according to claim 9, wherein the bottom electrode of the MTJ stack has a tapered edge comprising a third width at an upper portion of the bottom electrode and a fourth width at a lower portion of the bottom electrode, wherein the third width is less than the second width.

13. The semiconductor device according to claim 9, wherein the bottom electrode of the MTJ stack has a tapered edge comprising a third width at an upper portion of the bottom electrode and a fourth width at a lower portion of the bottom electrode, the top electrode of the MTJ stack has a tapered edge comprising a fifth width at an upper portion of the top electrode and a sixth width at a lower portion of the top electrode, wherein the third width is greater than the sixth width.

14. A semiconductor device comprising:

a magnetic tunnel junction (MTJ) stack, wherein a vertical side surface of the MTJ stack comprises a saw tooth edge, wherein a tunnel barrier layer of the MTJ stack includes a horizontal section and an angled vertical section, wherein a bottom electrode of the MTJ stack has at least one angled sidewall, wherein the at least one angled side wall of the bottom electrode is angled towards the reference layer located on top of the bottom electrode;

a dielectric layer located around the MTJ stack; and a liner located between the angled vertical section of the tunnel barrier layer and the dielectric layer.

15. The semiconductor device according to claim 14, wherein a free layer of the MTJ stack has a tapered edge comprising a first width at an upper portion of the free layer and a second width at a lower portion of the free layer, wherein the first width is greater than the second width.

16. The semiconductor device according to claim 14, wherein a reference layer of the MTJ stack has a tapered edge comprising a third width at an upper portion of the reference layer and a fourth width at a lower portion of the reference layer, wherein the third width is greater than the second width.

17. The semiconductor device according to claim 14, wherein the tunneling barrier of the MTJ stack has a tapered edge comprising a third width at an upper portion of the tunneling barrier and a fourth width at a lower portion of the tunneling barrier, wherein the third width is greater than the second width.

18. The semiconductor device according to claim 14, wherein a bottom electrode of the MTJ stack has a tapered edge comprising a third width at an upper portion of the bottom electrode and a fourth width at a lower portion of the bottom electrode, wherein the second width is greater than the third width.

\* \* \* \* \*